Nov. 8, 1966 M. J. MÉNORET ET AL 3,284,643

HIGH FREQUENCY, SINGLE JUNCTION, BIPOLAR TRANSISTOR

Filed Jan. 6, 1964

3 Sheets-Sheet 1

HIGH FREQUENCY, SINGLE JUNCTION, BIPOLAR TRANSISTOR

Filed Jan. 6, 1964 3 Sheets-Sheet 2

United States Patent Office 3,284,643

Patented Nov. 8, 1966

3,284,643
HIGH FREQUENCY, SINGLE JUNCTION, BIPOLAR TRANSISTOR

Maurice J. Ménoret, 12 Ave. de Verdum, Chatillon-sous-Bagneux, France, and Marc E. Savelli, deceased, late of Frejus, France, by Reneé Savelli, widow representative, 10 Caracas, Frejus, France

Filed Jan. 6, 1964, Ser. No. 339,057
Claims priority, application France, Jan. 7, 1963, 920,664/63
5 Claims. (Cl. 307—88.5)

This invention relates to a bipolar transistor comprising only two semiconductive regions of opposite types of conductivity and separated from one another by a single junction, the transistor according to the invention having electrical properties which are considerably better than those of the conventional two-junction bipolar transistors.

Transistors are known—more particularly from French Patent No. 990,032, entitled "Signal-Converting Device," filed in the name of Western Electric Company on July 2, 1949—which may have only a single rectifying contact known as the emitter and formed by a point or a junction, and two ohmic contacts, known as the base contact and collector contact, the emitter electrode being separated from the collector electrode by a zone of very narrow cross-section in which a very strong field is applied to the charge carriers to reduce their transit time. In such transistors, a high output impedance—upon which power gain depends—can be provided only by high resistivity and considerable elongation of the very narrow-cross-section zone; the performances of such transistors are therefore limited, particularly as power transistors, and bipolar transistors are usually preferred wherein the high output impedance is produced by the resistance of the reverse-biased collector-base junction.

The frequency response of conventional bipolar transistors depends of course upon the transit time of the load carriers in the base zone—i.e., upon the path which they have to travel along in the base zone—and upon the capacitance of the base-collector junction, for at high frequencies such capacitance tends to become a short circuit across the load impedance connected between the collector and the base. Techniques such as diffusion and epitaxy can provide bases of very reduced thickness and of large cross-section, but the only other known way of reducing the capacitance of the base-collector junction is to reduce the area thereof, with a consequent reduction in permissible current flow and therefore in power. Consequently, power transistors of the conventional bipolar kind can operate only at relatively low frequencies, while the high-frequency types can deal with only a small power.

The subject matter of the invention is to provide bipolar transistors free from these limitations.

The speed of the charge carriers in a semiconductive substance is of course a function of the electric field applied to them; above a field value known as the "critical field" there is no further acceleration of the charge carriers because they have reached a critical speed which depends upon the nature of the semiconductor. The number of charge carriers flowing through a given cross-section of the semiconductor in a given time therefore stays substantially constant when the electric field increases beyond the critical field—i.e., since the current flowing through such cross-section becomes substantially constant, the differential resistance of the semiconductor experiencing such field becomes very high. For equality of cross-sections, the differential resistance is of the same order as for a conventional reverse-biased collector-base transistor junction.

According to one feature of the single-junction bipolar transistor provided by the invention, the collector-base junction of conventional bipolar transistors is replaced by a semiconductive zone to which an electric field greater than the critical field is applied so that the output impedance of the single-junction transistor is not shunted by a stray capacitance such as the junction capacitance and stays very high even at very high frequencies; consequently, the single-junction transistor according to the invention can deliver appreciable power at frequencies of over 1000 mc./s.

According to the invention, a bipolar transistor is formed by a semiconductive member comprising a junction between a main region of one conductivity-type and a region of the opposite conductivity-type, the main region comprising a projecting part of reduced cross-section, an emitter electrode in ohmic contact with the region of the opposite conductivity-type, a collector electrode in ohmic contact with the free end of the said projecting part, and a base electrode in ohmic contact with such a part of the main region as does not comprise the said projecting part.

Since the emitter electrode is biased relatively to the base in a direction appropriate for the single junction of the transistor to operate as a diode in the conductive direction, and since the collector electrode is biased to a potential high enough to ensure that a field at least equal to the critical field exists in the said projecting part, the charge carriers leaving the single junction diffuse in the base region where they are minority carriers and are mostly accelerated to their critical speed in the projecting part as far as the collector whence an equivalent current of majority carriers flows in the opposite direction to restore the electric neutrality of the system, so that a current gain of the order of two is provided. Consequently, if such a transistor is used as an amplifier with, connected between the collector and the base, a load resistance of a value less than or equal to the differential resistance of the semiconductive base-collector zone at critical-speed conditions, but much higher than the resistance of the forwards-biased emitter-base diode plus the base resistance, the application of an A.C. signal between the emitter and the base produces in the load resistance a stronger alternating current than the alternating current flowing between the emitter and the base.

The basic structure of a first embodiment of a transistor according to the invention is a circular wafer or the like made of a semiconductive substance, for instance, of n-type conductivity, whose first side comprises in its central part a p-type semiconductive region formed, for instance, by the diffusion of appropriate dopes, while the second side has at the centre a cylindrical projection of a length and diameter such that an electric field greater than the critical field can be produced in such projection; the base electrode secured to the second side of the wafer surrounds the cylindrical projection; the collector electrode covers the end part of the projection; and the emitter electrode is secured to the outside surface of the p-type region.

The fundamental structure of a second embodiment of a transistor according to the invention is a circular wafer of, for instance, an n-type semiconductive substance which is heavily doped over most of its thickness except near its obverse formed by a substantially plane surface having at its centre a cylindrical projection of a length and diameter such that an electric field greater than the critical field can be produced in such projection; the base electrode is secured to the heavily doped reverse of the wafer; the collector electrode is in ohmic contact with the end part of the cylindrical projection; and the emitter electrode is formed by a junction produced by surface alloying of the obverse of the wafer around such projection.

Special structures can be derived from the basic structures as just described by rotation of a diametric section thereof either around an axis perpendicular to the plane of the wafer, so that plane structures having annular electrodes are provided, or around axes parallel to the plane of the wafer, so that cylindrical structures are provided.

The invention will be better understood from a study of the following description and of the accompanying drawings wherein.

Figure 6:
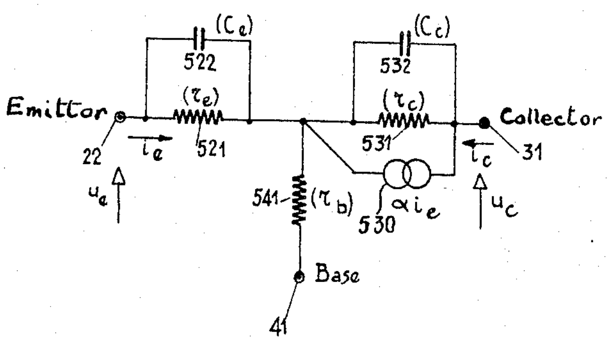

FIGS. *5a–5g* show various stages in the manufacture of a transistor in accordance with the second embodiment, and FIG. 6 illustrates the equivalent circuit diagram of the single-junction transistor according to the invention.

Figure 1:
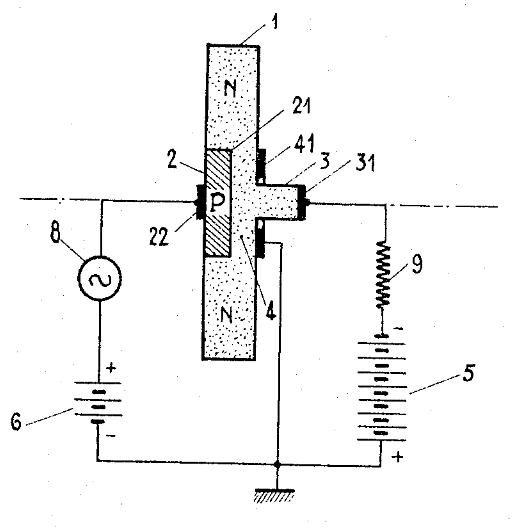
FIG. 1 is a section through a single-junction transistor according to a first embodiment of the invention.

FIG. 1 is a view in cross-section of a wafer 1 which is, for instance, circular and which is of n-type germanium and whose central part has on a first side a p-type region 2 prepared by any known conventional process (diffusion or alloying) to provide a single junction 21 of the transistor. The outside surface of the region 2 has an ohmic contact 22 for connection of the emitter electrode thus embodied to an external electric circuit. The wafer 1 has at the centre of its second side a cylindrical projection 3 cut by some known process, for instance, chemical etching using C.P. 4. The diameter of the projection 3 is of the order of 50$\mu$. Its length is of the order of from 5 to 10$\mu$. The end of the projection 3 has an ohmic contact 31 which connects the collector electrode to the external electric circuit.

The bottom part of the projection 3 has engaging around it an ohmic contact 41 disposed on the outside surface of the second side of the wafer 1. The ohmic contact 41 is the base electrode of the transistor according to the invention, the base 4 thereof being formed by the semiconductive central part of the wafer 1 between the junction 21 and the electrode 41.

The collector 31 is negatively biased to the base 4 by a D.C. source 5 of a voltage high enough to ensure that the electric field produced in the semiconductive projection 3 is greater than the critical field at which the differential resistance of the semiconductive projection 3 becomes very high; the critical field for germanium is 3000 volts/cm., for silicon 1500 volts/cm. and for gallium arsenide 200 volts/cm. The emitter-base junction 21 is forwards-biased by a D.C. source 6. The junction 21, being at a positive potential, injects minority carriers—i.e., holes—into the base 4 which extends between the junction 21 and the electrode 41 and whose thickness of a fraction of a millimetre is less than the diffusion length—i.e., the mean diffusion distance covered by an injected minority carrier before recombination. Most of these minority carriers or holes are collected by the projection 3 in which the strong electric field produced by the source 5 accelerates them to their critical speed which is, for instance, $5.10^6$ cm./sec. for germanium.

The electrons normally present in the n-type semiconductor of the collector 3 are repelled by the negative potential applied to the collector electrode and diffuse towards the base 4, so that the collector 3 stays electrically neutral, and produce therein an electric current which is added to the current produced by the holes, to give a current gain of the order of two. When an A.C. source 8 is connected into the circuit of the emitter 2 and a load resistor 9 of value R is connected in the collector circuit 3, a current $i_e$ produced by the source 8 causes a current $i_c$ greater than $i_e$ to flow through the load resistor 9. Since the input signal is applied across a low impedance—i.e., the impedance of the forwards-biased junction 21—and assuming that the output signal were to be delivered by a source whose impedance is the very high differential resistance of the collector, the power $Ri_c^2$ collected in the receiver is considerable over a frequency range up to as much as 1000 mc./s.

Figure 2:
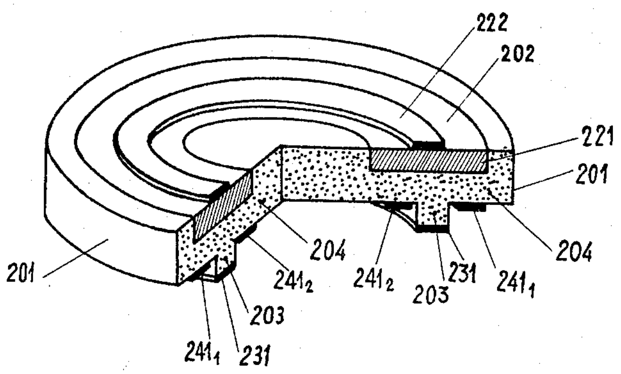
FIGS. 2–4 illustrate structures derived from the structure illustrated in FIG. 1.
Figure 3:
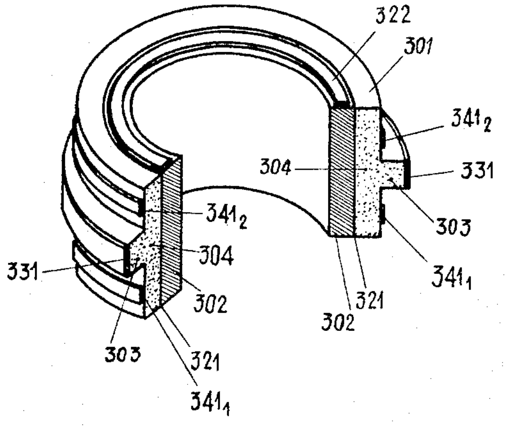
Figure 4:
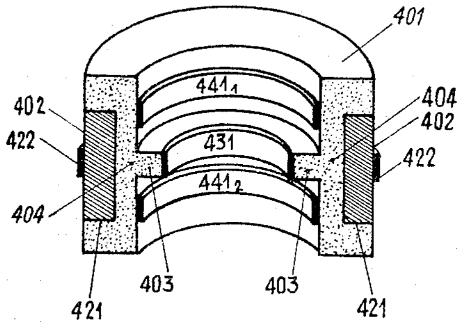

FIGS. 2–4 illustrate by way of nonlimitative example cylindrical or toroidal structures derived from the structure illustrated in FIG. 1; parts corresponding to parts of the transistor illustrated in FIG. 1 have the same references but with additions of 200 (FIG. 2), 300 (FIG. 3) and 400 (FIG. 4).

The structure illustrated in FIG. 2 belongs to the kind of transistors having annular electrodes and is derived from the structure illustrated in FIG. 1 by rotation of a diametric section thereof around an axis perpendicular to its plane. Consequently, its ohmic base contact is subdivided into two concentric parts $241_1$, $241_2$ disposed one on each side of the annular projection 203.

The structure illustrated in FIG. 3 is derived from the structure illustrated in FIG. 1 by rotation of a diametric section thereof around an axis parallel with its plane and disposed on the same side as its emitter electrode. As in FIG. 2, the ohmic base contact is subdivided into two parts $341_1$, $341_2$ disposed one on either side of the annular projection 303.

The structure illustrated in FIG. 4 is derived from the structure illustrated in FIG. 1 by rotation of a diametric section thereof around an axis parallel with its plane and disposed on the same side as its collector electrode.

FIGS. *5a–5g* illustrate the transistor according to a second embodiment of the invention in various stages of a manufacturing process using known technologies, the process being given by way of nonlimitative example. The single-junction transistor illustrated in FIG. *5g* is formed from an $n^+$-type silicon wafer 1 having a resistivity of 0.01 ohm./cm. and a thickness of the order of 200$\mu$.

The manufacturing process comprises eight stages:

(1) The silicon wafer 10 is covered on its obverse by a layer of n-type silicon 11 having a thickness of 15$\mu$ and a resistivity above 100 ohm./cm., as shown in FIG. *5a*. The layer 11 can be produced epitaxially by placing the wafer 10 in an oven which is at a temperature of 1200° C. and in which, for instance, silicon tetrachloride vapours circulate.

(2) The wafer is then placed in a diffusion oven in which a dope, such as phosphorus, is vapourised. Then, as shown in FIG. *5b*, the layer 11 has diffused on to it a thin $n^+$-type silicon layer 12 which is about 5$\mu$ thick and which helps to improve transistor efficiency by reducing the ohmic resistance of the collector contact which will be prepared during the next stage. As it is known, the resistivity of the diffused $n^+$-type layer 12 varies from the resistivity of the n-type layer 11 at their common boundary to a weakened non-critical resistivity at the surface of the layer 12 exposed to the highly doping diffusion.

(3) A chromium and gold ohmic contact 13 is deposited on the layer 12 by consecutive evaporation of the chromium and gold through a metal mask whose single aperture is a circle having a diameter of 50$\mu$ (FIG. *5c*).

(4) Treatment such as chemical etching using C.P. 4 is given so that that part of the $n^+$-type layer 12 which is below the ohmic contact 13 is unaffected but some of the n-type layer 11 is etched to form therein a projecting zone 14 which will subsequently form the collector (FIG. *5d*).

(5) A layer 15 of aluminium is applied by vapour coating to the exposed part of the surface of the zone 11. The contact 13 provides by shade effect a separation between the aluminium layer 15 and the base of the projection 14.

Figure 5A:
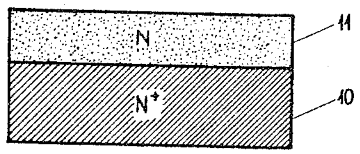
Figure 5B:
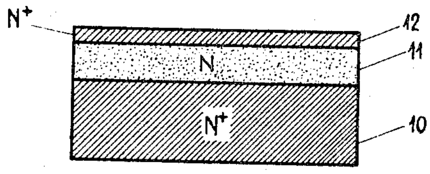
Figure 5C:
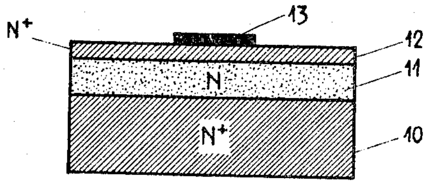
Figure 5D:
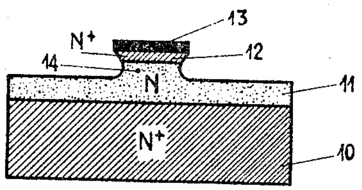
Figure 5E:
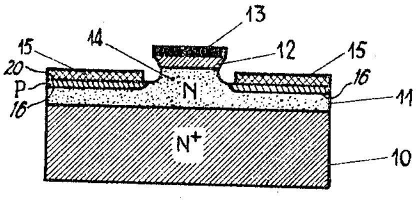

(6) The wafer is then heated to 580° C. to alloy the aluminium 15 with the n-type silicon, so that a very thin p-type region 20, and a junction 16 forming the emitter-base junction of the transistor, are produced in the n-type silicon (FIG. 5*e*).

Figure 5F:
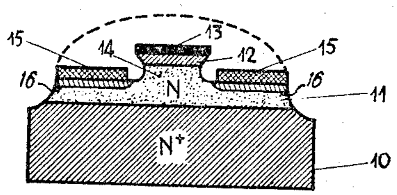
Figure 5G:
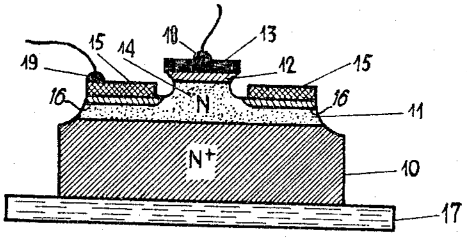

(7) To bound the surface of the zone 15 as shown in FIG. 5*f*, the central part 13 and a part of the zone 15 are covered by a drop of wax (as shown in broken line), whereafter chemical etching is given with C.P. 4.

(8) The wafer is welded at 450° C., by formation of a gold-silicon eutectic, to a gilded metallic plate 17 serving as ohmic contact for the transistor base, and lead wires 18, 19 are welded by heat compression to the ohmic contact 13 and aluminium 15 respectively, the wire 18 forming the collector lead and the wire 19 forming the emitter lead.

FIG. 6 is the familiar diagram of the equivalent circuit to conventional bipolar transistors in a common base arrangement. This equivalent circuit diagram can also be used for the single-junction transistor hereinbefore described and help to compare the novel transistors with the conventional ones, for the only difference between them is that the collector zone, which is a backwards-biased diode in conventional transistors, is formed in the single-junction transistors according to the invention by a semiconductor portion where the charge carriers have reached their critical speed.

Referring to FIG. 6, the emitter electrode, to whose contact 22 a bias voltage $u_e$ is applied and through which a current $i_e$ flows, is assimilated to an ohmic resistance 521 which is of value $r_e$ and which is shunted by a capacitor 522 of capacitance $C_e$. The capacitance $C_e$ of the emitter-base junction is not very disturbing even at very high frequencies since such capacitance is shunted across the transistor input impedance $r_e$ which is low. The resistance of the base 41 is represented by a resistance 541 of value $r_b$. The collector electrode to whose contact 31 a bias voltage $u_c$ is applied and through which a current $i_c$ flows is likened to a circuit comprising in parallel an ohmic resistance 531 of value $r_c$, a capacitor 532 of capacitance $C_c$, and a source 530 supplying a current $\alpha i_e$, $\alpha$ being the current amplification factor of the transistor.

In the case of a conventional transistor, the capacitance $C_c$ is the capacitance of the capacitor formed by the backwards-biased diode formed by the collector and the base, such capacitance having a physical existence. In the case of the single-junction transistor according to the invention, the capacitance $C_c$ is the capacitance of an imaginary capacitor—i.e., in accordance with the interpretation of the events which has just been given, it is as if a condenser 532 were present whose capacitance is related to the transit time of the charge carriers moving at the critical speed in the semiconductive zone. The order of magnitude of such transit time is 100 picoseconds for a collector about 5$\mu$ long and for a critical charge carrier speed of $5.10^6$ cm./sec.

When a comparison is made between two transistors which have the same geometry, and the same internal structure of the emitter and the base but whose collector geometries are such that the two transistors considered can dissipate the same power, it is found by experience that the values of resistances, capacitances and other characteristics concerning the equivalent circuit diagrams of the two transistors are as given in the following table.

| Designation of elements and characteristics | Conventional Transistor | Single-junction Transistor |
|---|---|---|
| Resistance 521 | $r_e$=3 ohms | $r_e$=3 ohms. |
| Capacitance 522 | $C_e$=200 picofarads | $C_e$=200 picofarads. |
| Resistance 541 | $4_b$=50 ohms | $r_b$=50 ohms. |
| Resistance 531 | $r_c=10^6$ ohms | $r_c=10^6$ ohms. |
| Capacitance 532 | $C_c$=50 picofarads | $C_c$=2 pirofarads. |
| Current amplification factor. | $\alpha$=0.98 | $\alpha$=1.5. |
| Critical cut-off | 200 mc./s | 200 mc./s. |
| Maximum oscillation frequency. | 50 mc./s | 250 mc./s. |

The table shows that the critical cut-off frequency above which the current gain $\alpha$ decreases appreciably is the same for both kinds of transistors, but the maximum oscillation frequency—i.e., the frequency at which the power gain is unity—actually, the maximum usable frequency—is five times higher for the single-junction transistor than for the conventional transistor. In other words, the high-frequency power gain, which is proportional to $\alpha/r_bC_c$ is 25 times greater for a single-junction transistor than for the conventional transistor since the capacitance $C_c$ of the single-junction transistor is 25 times less than the same capacitance of the conventional transistor.

The transistor according to the invention has a very good temperature behaviour. The family of current-voltage characteristic curves of a conventional transistor shift of course towards increased collector currents $i_c$ when the ambient temperature rises, with the possibility of starting a cumulative action leading to destruction of the transistor. The single-junction transistor according to the invention, however, has a family of current-voltage characteristic curves which shift towards decreased collector currents $i_c$ for increasing temperature. There is therefore an internal stabilising effect so that the auxiliary stabilising network conventional in circuit arrangements comprising conventional transistors can be omitted.

What we claim is:

1. A single junction bipolar transistor comprising a circular semiconductor wafer body provided on one side thereof with a coaxial cylindrical projection of reduced cross section, said body having a first circular region including said projection of a given type of conductivity, said body having a second circular region which is coaxially included in the side of said first region opposite to said projection and which is of the opposite type of conductivity, a junction between said first and second regions, an emitter electrode in ohmic contact with said second region, a collector electrode in ohmic contact with the free end of said projection and an annular base electrode coaxially surrounding said projection in spaced relation thereto and being in ohmic contact with said first region.

2. A single junction bipolar transistor comprising a circular semiconductor wafer body provided on one side thereof with a coaxial annular projection of reduced cross-section, said body having a first circular region including said projection of a given type of conductivity, said body having a second annular region which is coaxially included in the side of said first region opposite to said projection and which is of the opposite type of conductivity, a junction between said first and second regions, an emitter electrode in ohmic contact with said second region, a collector electrode in ohmic contact with the free end of said projection and a biannular base electrode coaxially encompassing said projection in spaced relation thereto and being in ohmic contact with said first region.

3. A single junction bipolar transistor comprising a cylindrical hollow semiconductor body provided thereof in the central part of one of its cylindrical faces with a coaxial annular projection of reduced cross section, said body having a first cylindrical region including said projection of a given conductivity-type, said body having a second cylindrical region which is coaxially included in the face of said first region opposite to said projection and which is of the opposite conductivity-type, a junction between said first and second regions, an emitter electrode in ohmic contact with said second region, a collector electrode in ohmic contact with the free end of said projection, and a base electrode formed of two rings respectively disposed on both sides of said projection in spaced relation with the same and being in ohmic contact with said first region.

4. A semiconductor device comprising a semiconductor wafer body provided on one side with a projecting part of restricted cross section, said wafer body comprising a first region including said projection part of a given conductivity-type, said body having a second region of the opposite conductivity-type, a junction between said second region and a first part of said first region which is in spaced relation with said projecting part, an emitter electrode in ohmic contact with said second region, a collector electrode in ohmic contact with the free end of said projecting part, a base electrode in ohmic contact with a second part of said first region in spaced relation with said projecting part; first biasing means connected between said emitter and base electrodes and biasing said junction in the conductive direction; and second biasing means connected between said collector and base electrodes, and generating in said projecting part a field at least equal to the critical field of said semiconductor, whereby a current gain of the order of two is obtained.

5. A method of manufacturing a single junction bipolar transistor from a $n^+$-type silicon wafer having a resistivity of about 0.01 ohm/cm. and a thickness of the order of 200$\mu$ comprising the following steps:

(a) forming epitaxially on one face of said wafer a layer of n-type silicon having a thickness of about 15$\mu$ and a resistivity above 100 ohm/cm.;

(b) highly doping a superficial layer having a thickness of about 5$\mu$ of said epitaxial layer by vapor diffusion of a donor;

(c) depositing a chromium and gold ohmic contact on a central circle having a diameter of about 50$\mu$ of said highly doped surface by consecutive evaporation of chromium and gold through an aperture of a metal mask;

(d) dissolving the ungilded part of said highly doped layer and a part of the thickness of the underlying epitaxial layer by chemical etching to form a projecting part, the free end of which is covered by said chromium and gold contact;

(e) applying an aluminum layer by vapor coating to the exposed part of said epitaxial layer, said chromium and gold contact providing by shade effect a separation between said aluminum layer and the base of said projecting part;

(f) forming a thin superficial p-type region in the aluminum coated part of said epitaxial layer by heating said wafer to 580° C.;

(g) welding a collector lead to said chromium and gold contact and an emitter lead to said aluminum layer by heat compression; and, (h) welding a gilded plate serving as ohmic contact for the transistor base to the opposite face of the wafer by heating said wafer to 450° C.

References Cited by the Examiner

UNITED STATES PATENTS

| | | | |
|---|---|---|---|
| 3,025,438 | 3/1962 | Wegener | 317—234 |
| 3,152,294 | 10/1964 | Siebertz et al. | 317—235 |
| 3,171,042 | 2/1965 | Matere | 307—88.5 |

FOREIGN PATENTS

| | | |
|---|---|---|
| 1,195,298 | 11/1959 | France. |

OTHER REFERENCES

Webster's Third International Dictionary (unabridged) page 1559.

JOHN W. HUCKERT, *Primary Examiner.*

M. EDLOW, *Assistant Examiner.*